United States Patent
Lee et al.

(10) Patent No.: US 7,217,618 B2
(45) Date of Patent: May 15, 2007

(54) SEMICONDUCTOR DEVICE AND METHOD FOR FABRICATING THE SAME USING DAMASCENE PROCESS

(75) Inventors: Chang-Huhn Lee, Gyeonggi-do (KR); Mun-Mo Jeong, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 221 days.

(21) Appl. No.: 10/678,530

(22) Filed: Oct. 3, 2003

(65) Prior Publication Data
US 2004/0077143 A1    Apr. 22, 2004

(30) Foreign Application Priority Data
Oct. 18, 2002    (KR) ................ 2002-63979

(51) Int. Cl.
*H01L 21/8242* (2006.01)
(52) U.S. Cl. .............. 438/253; 257/E21.008; 257/E21.011; 438/254
(58) Field of Classification Search ........ 438/623, 438/239, 393, 700, 692, 253, 254; 257/306, 257/303, 577, E21.008, E21.011
See application file for complete search history.

(56) References Cited

U.S. PATENT DOCUMENTS

| | | | | |
|---|---|---|---|---|
| 5,648,287 A | * | 7/1997 | Tsai et al. ........... | 438/305 |
| 6,130,102 A | * | 10/2000 | White et al. ........... | 438/3 |
| 6,153,510 A | * | 11/2000 | Ishibashi ........... | 438/622 |
| 6,300,191 B1 | * | 10/2001 | Yu et al. ........... | 438/253 |
| 6,344,389 B1 | * | 2/2002 | Bronner et al. ........... | 438/244 |
| 6,383,863 B1 | * | 5/2002 | Chiang et al. ........... | 438/241 |
| 6,613,670 B2 | * | 9/2003 | Rha et al. ........... | 438/657 |
| 2003/0232471 A1 | * | 12/2003 | Yokoyama ........... | 438/253 |
| 2004/0038478 A1 | * | 2/2004 | Tang ........... | 438/254 |

OTHER PUBLICATIONS

IBM Tech. Discl. Bull. vol. 19, No. 6, pp. 2047-2048 (Nov. 1976), (displayed on 1 page).*

* cited by examiner

*Primary Examiner*—Caridad Everhart
(74) *Attorney, Agent, or Firm*—Marger Johnson & McCollom, P.C.

(57) ABSTRACT

A semiconductor device and method for fabricating same according to an embodiment of the invention includes: preparing a semiconductor substrate having a first contact pad and a second contact pad; forming a first insulating film on the substrate; etching the first insulating film to form a groove-shaped bit line pattern and a contact exposing the first contact pad and the second contact pad, respectively; simultaneously forming a contact plug and a bit line in the contact and the bit line pattern, respectively, the contact plug and the bitline having upper surfaces that are coplanar; and forming a bottom electrode for a capacitor that is connected to the first contact pad.

23 Claims, 9 Drawing Sheets

SEMICONDUCTOR DEVICE AND METHOD FOR FABRICATING THE SAME USING DAMASCENE PROCESS

CROSS REFERENCE TO RELATED APPLICATIONS

This application claims priority from Korean Patent Application No. 2002-63979, filed on Oct. 18, 2002 in the Korean Intellectual Property Office, the contents of which are hereby incorporated by reference in their entirety.

BACKGROUND OF THE INVENTION

1. Field of the Invention

This disclosure relates to a semiconductor device, and more particularly to a semiconductor device and method for fabricating the semiconductor device with damascene bit lines that improves the process margin and simplifies the fabrication process.

2. Description of the Related Art

As the size of semiconductor devices decrease, interconnections of the semiconductor devices become finer. Accordingly, etching the interconnection causes many problems. It has become more difficult to assure a process margin for a semiconductor device having a capacitor on a bit line COB structure while simultaneously maintaining the required dielectric properties between a storage node contact and bit line.

FIGS. 1A through 1D are cross sectional diagrams illustrating a method of fabricating a conventional semiconductor device having a Capacitor Over Bit-line (COB) structure.

Referring to FIG. 1A, a field isolation film 105 is formed on a field region of a semiconductor substrate 100, which includes an active region 101, through a conventional shallow trench isolation (STI) process.

A gate 110 having a stacked structure of a gate insulating film 111, a gate electrode material 112, and a capping layer 113 is formed on the semiconductor substrate 100. A spacer 115 is formed on the sidewall of the gate 110. A first interlayer insulating film 120 is formed on the substrate including the gate 110. Contacts 125 are formed to expose portions of the active region 101 through a self aligned contact (SAC) process.

A conductive material, such as a polysilicon film, is deposited on the substrate to fill the contacts 125 and then an etch back or chemical mechanical polishing (CMP) process is performed to form a storage node contact pad 131 and a bitline contact pad 135. At this time, the storage node contact pad 131 and the bitline contact pad 135 are connected to impurity regions (not shown) of a predetermined conductivity type, which are formed in the active region 101.

Next, a second interlayer insulating film 140 is deposited on the first interlayer insulating film 120 and then patterned to form a bit line contact 141 that exposes the bitline contact pad 135 of the contact pads 131 and 135.

Referring to FIG. 1B, a metal film, for example a tungsten film, is deposited on the substrate including the bit line contact 141 and then etched to form a bitline contact plug 145 in the bit line contact 141 through an etch back or a CMP process.

Next, a barrier metal film 161, a conducting material 162 for a bit line, and a capping material 163 for a bit line are sequentially formed on the second interlayer insulating film 140. The capping material 163, the conducting material 162, and the barrier metal film 161 are then etched using a mask (not shown) to form a bit line 160.

Next, a spacer material is deposited on the second interlayer insulating film 140 and the bit line 160 and is then etched to form a bit line spacer 165 on the side wall of the bit line 160.

Referring to FIG. 1C, a third interlayer insulating film 170 is deposited on the second interlayer insulating film 140 as well as the bit line 160, and then the second and third interlayer insulating films 140 and 170 are etched to form a storage node contact 171 exposing the storage node contact pad 131.

Referring to FIG. 1D, a conducting material for a contact plug, for example, a polysilicon film, is deposited on the third interlayer insulating film 170 to fill the storage node contact 171. The conducting material is then etched to form a storage node contact plug 175 in the storage node contact 171 through a CMP or etch back process.

Next, an etching stopper 180 and a mold oxide film (not shown) are deposited on the substrate, and then etched to form an opening (not shown) exposing the storage node contact plug 175. A polysilicon film for a storage node is deposited on the mold oxide film including the opening and then removes the mold oxide film during the CMP process for node separation. As a result, a storage node 190 of a capacitor that is in contact with the storage node contact plug 175 is formed.

As described above, since the conventional method for fabricating the semiconductor device to form bitlines includes depositing and patterning of metal film, the process is very complicated and very difficult. Also, it is difficult to assure the process margin while maintaining the required dielectric properties between a storage node contact and the bit line during the formation of the storage node contact.

Embodiments of the invention address these and other disadvantages of the prior art.

SUMMARY OF THE INVENTION

Embodiments of the invention provide a semiconductor device and a method for fabricating the semiconductor device by forming the storage node contact and then forming the bit line pattern, thereby improving the process margin while maintaining the dielectric property between a storage node contact and a bit line.

Another embodiment of the invention provides a semiconductor device and a method for fabricating the semiconductor device by simultaneously forming a damascene bit line and a storage node contact plug, thereby simplifying the fabrication process.

Yet another embodiment of the invention provides a semiconductor device and a method for fabricating the semiconductor device that is capable of increasing the capacitance of a capacitor along as well as increasing the storage node area.

BRIEF DESCRIPTION OF THE DRAWINGS

For a more complete understanding of the invention and the advantages thereof, reference is made to the following drawings, in which like reference numerals designate like elements.

DETAILED DESCRIPTION OF THE INVENTION

The semiconductor device and method for fabricating the device according to the embodiments of the invention will now be described with reference to the accompanying drawings.

FIGS. 2A through 2I are cross sectional diagrams illustrating a method of fabricating a semiconductor device having a COB structure according to an embodiment of the invention.

Figure 1A:
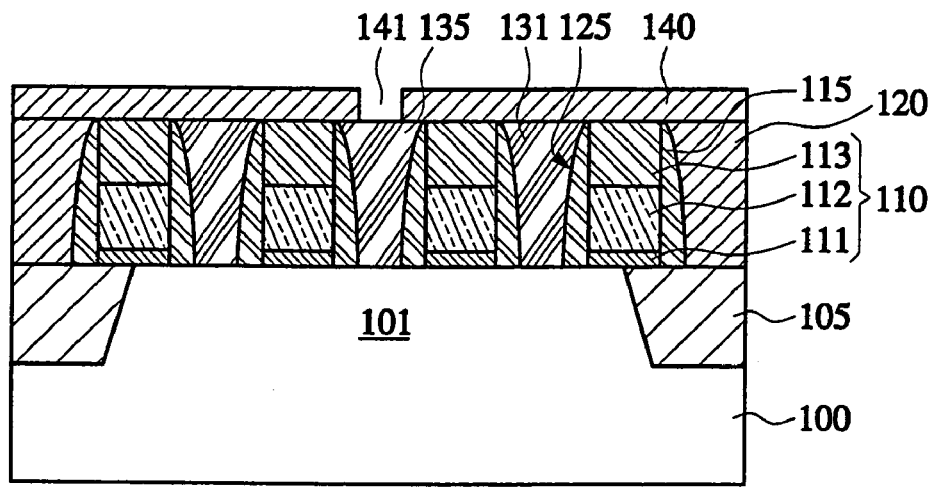
FIGS. 1A through 1D are cross sectional diagrams illustrating a method of fabricating a conventional semiconductor device having a conventional COB structure.
Figure 1B:
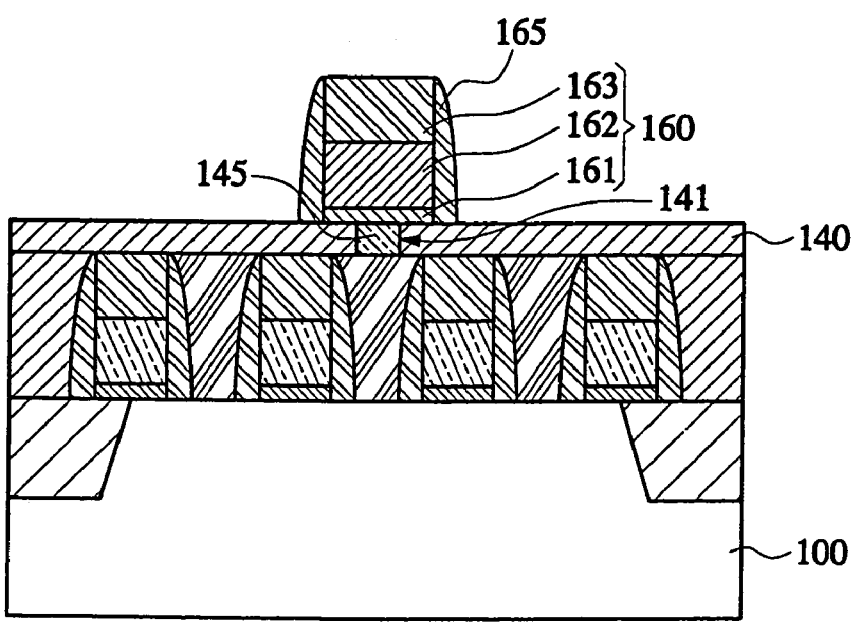
Figure 1C:
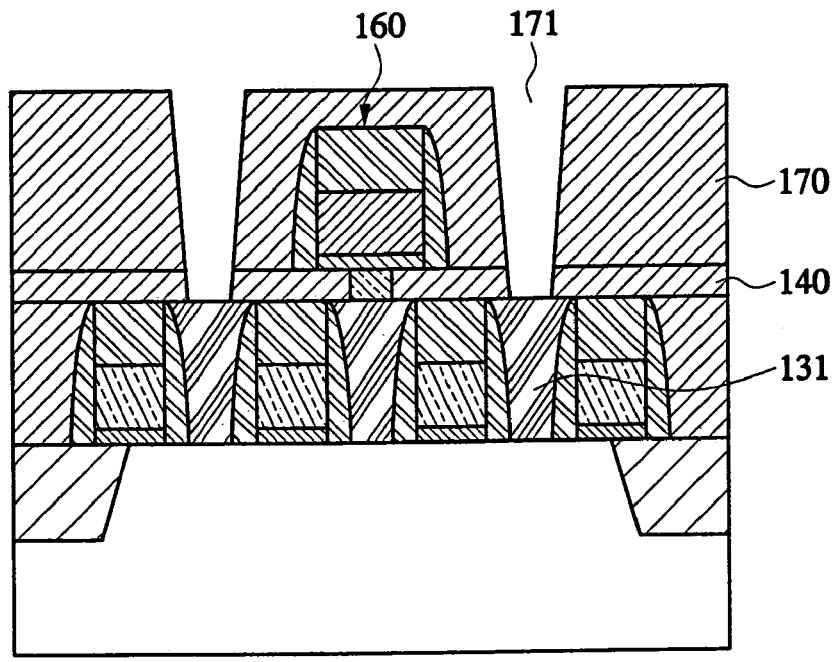
Figure 1D:
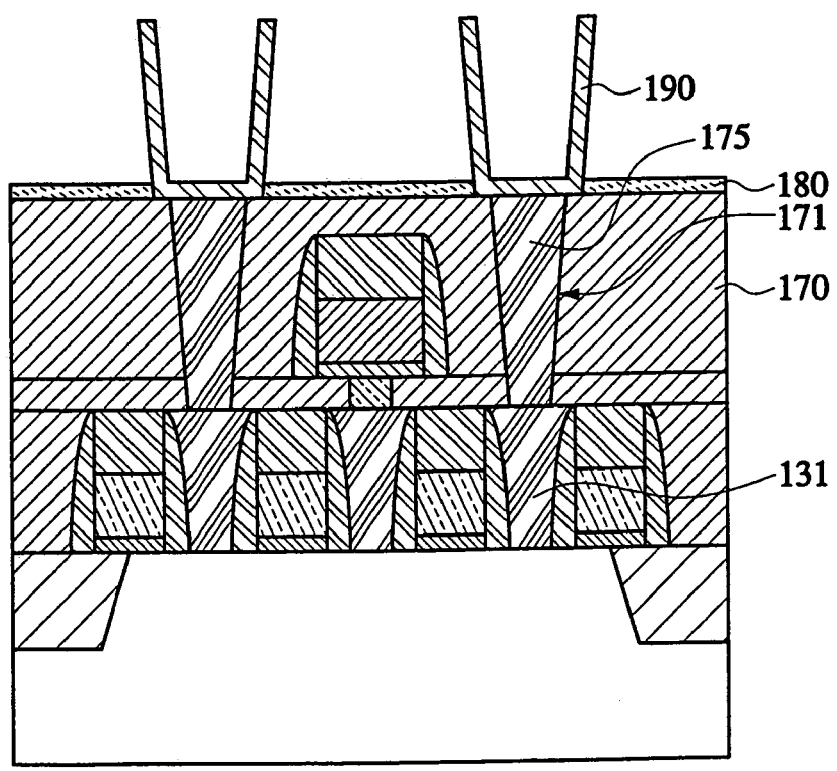
Figure 2A:
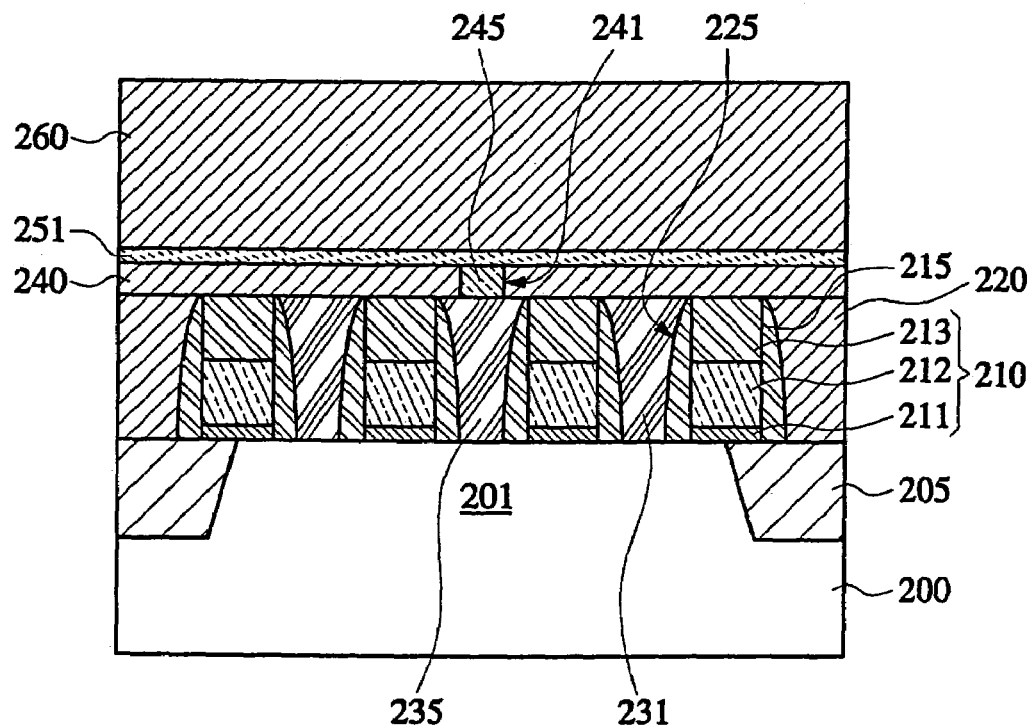
FIGS. 2A through 2I are cross sectional diagrams illustrating a method of fabricating a semiconductor device according to an embodiment of the invention.

Referring to FIG. 2A, a semiconductor substrate 200 includes an active region 201 and a field region (not shown). A field isolation film 205 is formed in the field region of the semiconductor substrate 200 through a conventional shallow trench isolation STI process.

A gate 210 having a stack structure of a gate insulating film 211, a gate electrode material 212, and a capping layer 213 is formed on the semiconductor substrate 100. A spacer 215 is formed on the sidewall of the gate 210.

A first interlayer insulating film 220 is deposited on the substrate including the gate 210 and is planarized by a CMP process or an etch back process. The first interlayer insulating film 220 is self-aligned and etched to form self-aligned contacts 225 exposing portions of the active region 201 between the gates.

A conductive material, such as a polysilicon film, is deposited on the substrate to fill the contacts 225. An etch back or CMP process is then used to form a storage node contact pad 231 and a bitline contact pad 235. The storage node contact pad 231 and the bitline contact pad 235 are connected via the contacts 225 to impurity regions (not shown) of a predetermined conductivity type formed in the active region 201.

Next, a second interlayer insulating film 240 is deposited on the first interlayer insulating film 220 and a CMP process or an etch back process for planarization is performed. The second interlayer insulating film 240 is etched to form a bit line contact 241 exposing the bitline contact pad 235 of the contact pads 231 and 235.

Next, a conductive material for a plug, for example, a metal film such as a tungsten film, is deposited on the substrate including the bit line contact 241. A CMP process is then used to form a bitline contact plug 245 in the bit line contact 241. Then, an etching stopper 251 and a third interlayer insulating film 260 are sequentially formed on the substrate.

Figure 2B:
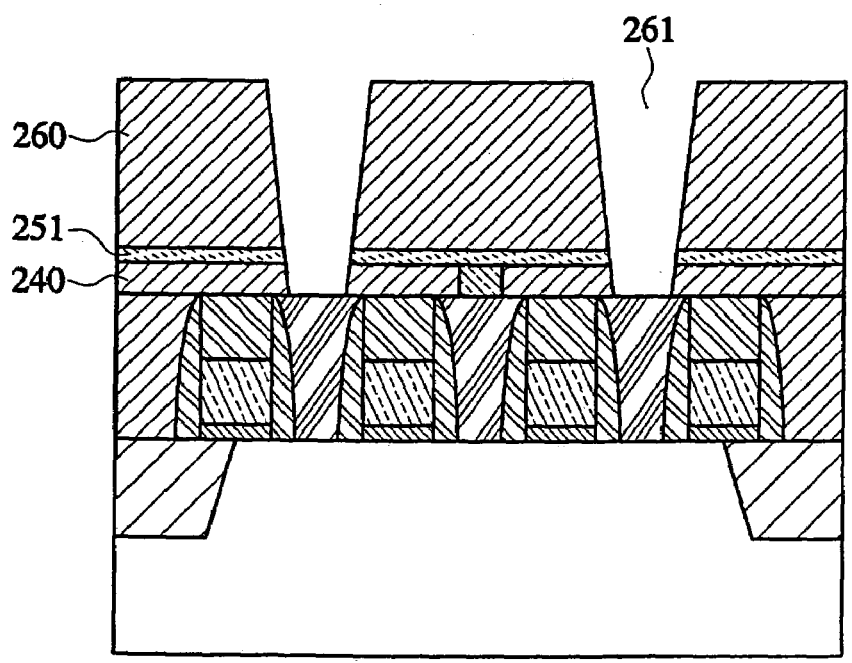

Referring to FIG. 2B, the third interlayer insulating film 260, the etching stopper 251, and the second interlayer insulating film 240 are etched to form a storage node contact 261 that exposes the storage node contact pad 231 of the contact pads 231 and 235.

Figure 2C:
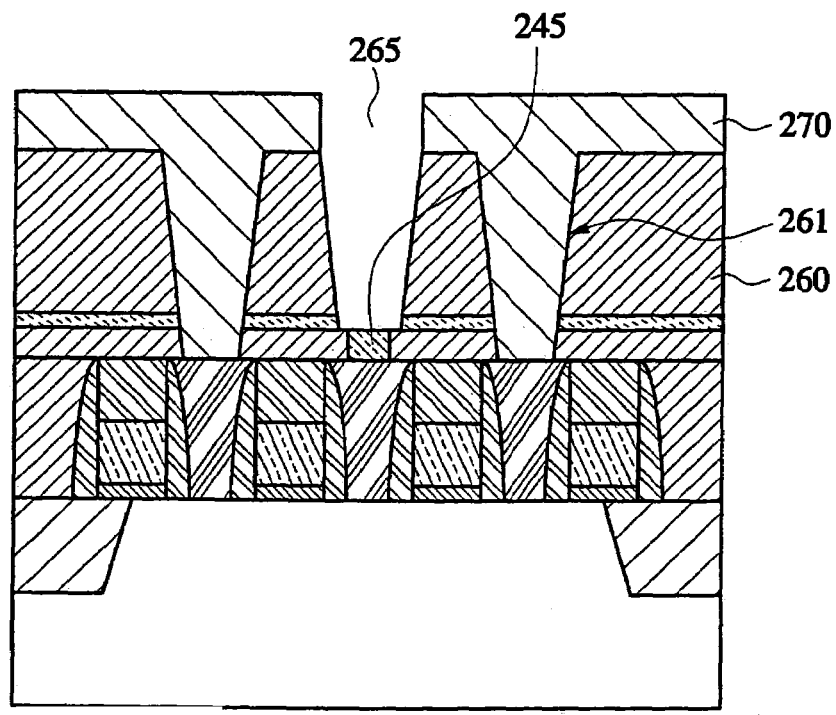

Referring to FIG. 2C, a photosensitive film 270 is formed on the third interlayer insulating film 260 including the storage node contact 261 and then patterned to expose a portion of the third interlayer insulating film 260 where a bit line pattern will be formed.

The exposed portion of the third interlayer insulating film 260 and the etching stopper 251 are etched using the patterned photosensitive film 270 as a mask to form the bit line pattern 265 exposing the bitline contact plug 245. At this time, the bit line pattern 265 is a damascene pattern for forming a bit line in the following process and has a grooved shape. Both the storage node contact 261 and the bit line pattern 265 are formed in the third interlayer insulating film 260, and, thus, the storage node contact 261 and the bitline pattern 265 have upper portions of the same level with each other without a step. In other words, the upper portions of the storage node contact 261 and the bitline pattern 265 formed in the interlayer insulation film 260 are coplanar.

Figure 2D:
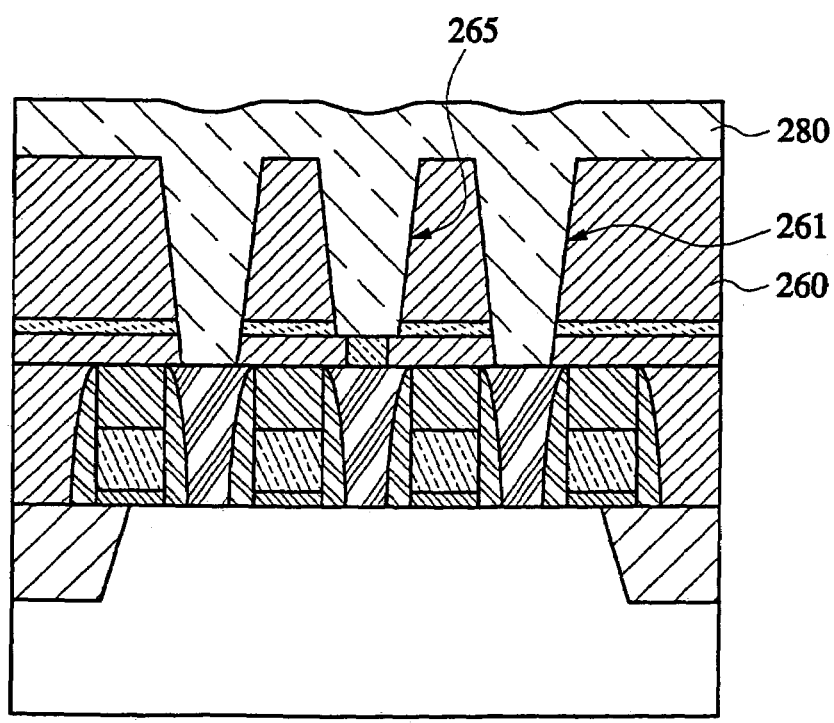

Referring to FIG. 2D, the photosensitive film 270 is removed. A conductive material for a bit line, for example, a metal film such as a tungsten film 280, is deposited on the third interlayer insulating film 260 including the storage node contact 261 and the bit line pattern 265.

Figure 2E:
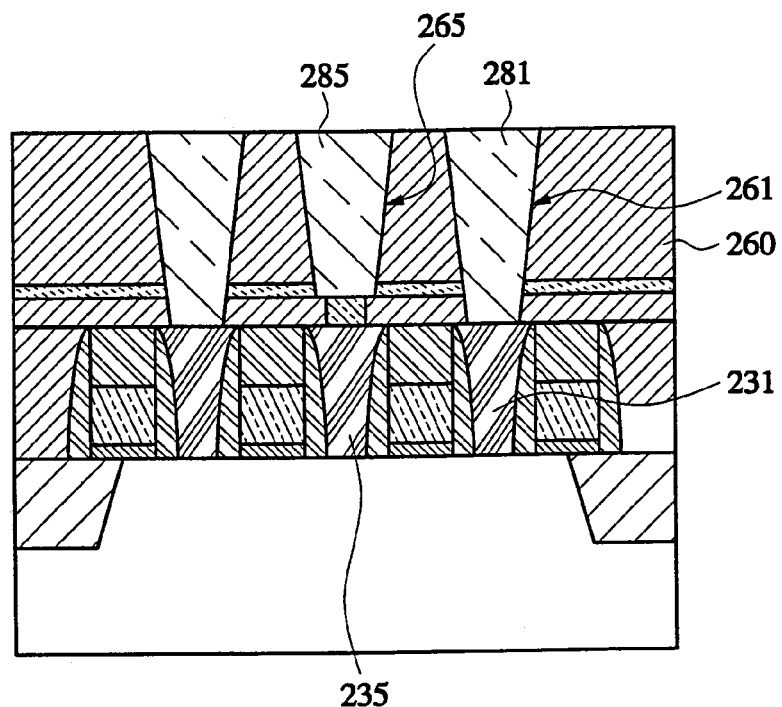

Referring to FIG. 2E, a bit line 285 in contact with the bitline contact plug 245 is formed in the bit line pattern 265 and simultaneously a storage node contact plug 281 in contact with the storage node contact pad 231 is formed in the storage node contact 261 by a CMP process on the tungsten film 280. Accordingly, the storage node contact plug 281 and the bit line 285 have upper surfaces of the same level with each other without a step. In other words, the upper surfaces of the storage node contact plug 281 and the bit line 285 are coplanar.

Figure 2F:
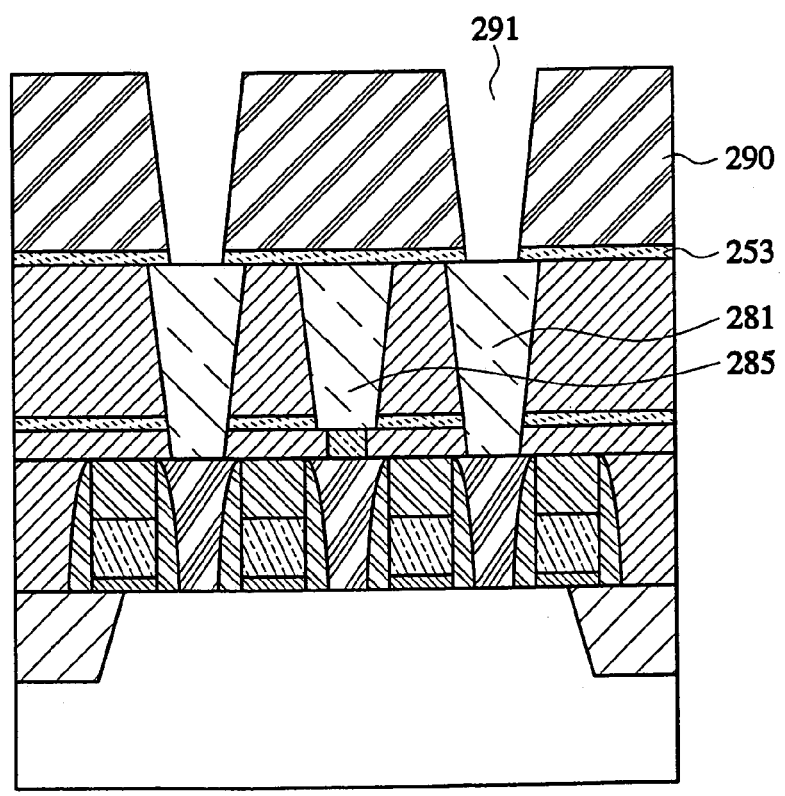

Referring to FIG. 2F, an etching stopper 253 and a mold oxide film 290 are deposited on the substrate. The mold oxide film 290 is a sacrificial oxide film for forming a storage node. The mold oxide film 290 and the etch stopper 253 are etched to form an opening 291 exposing the contact plug 281.

Figure 2G:
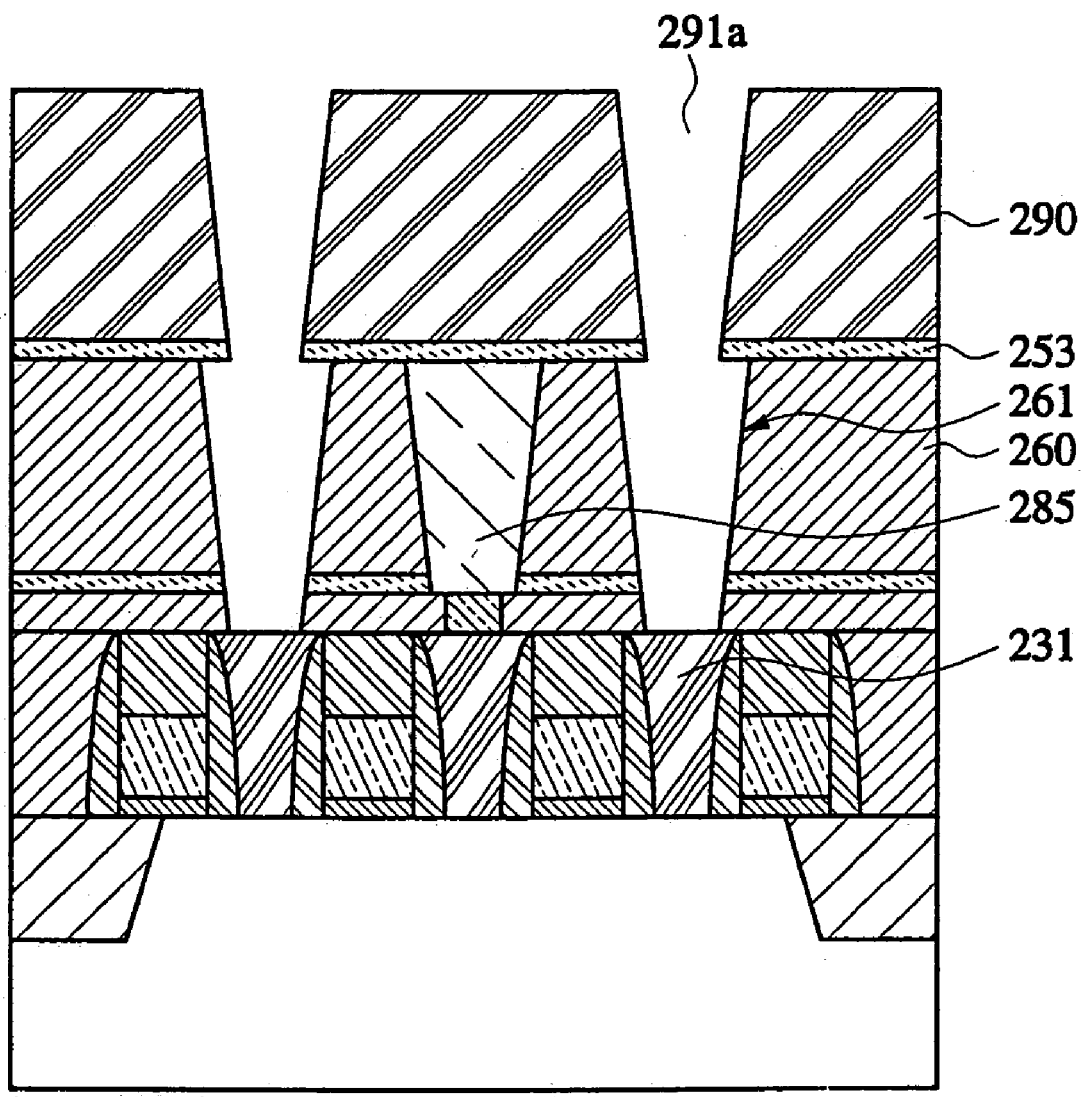
Figure 2H:
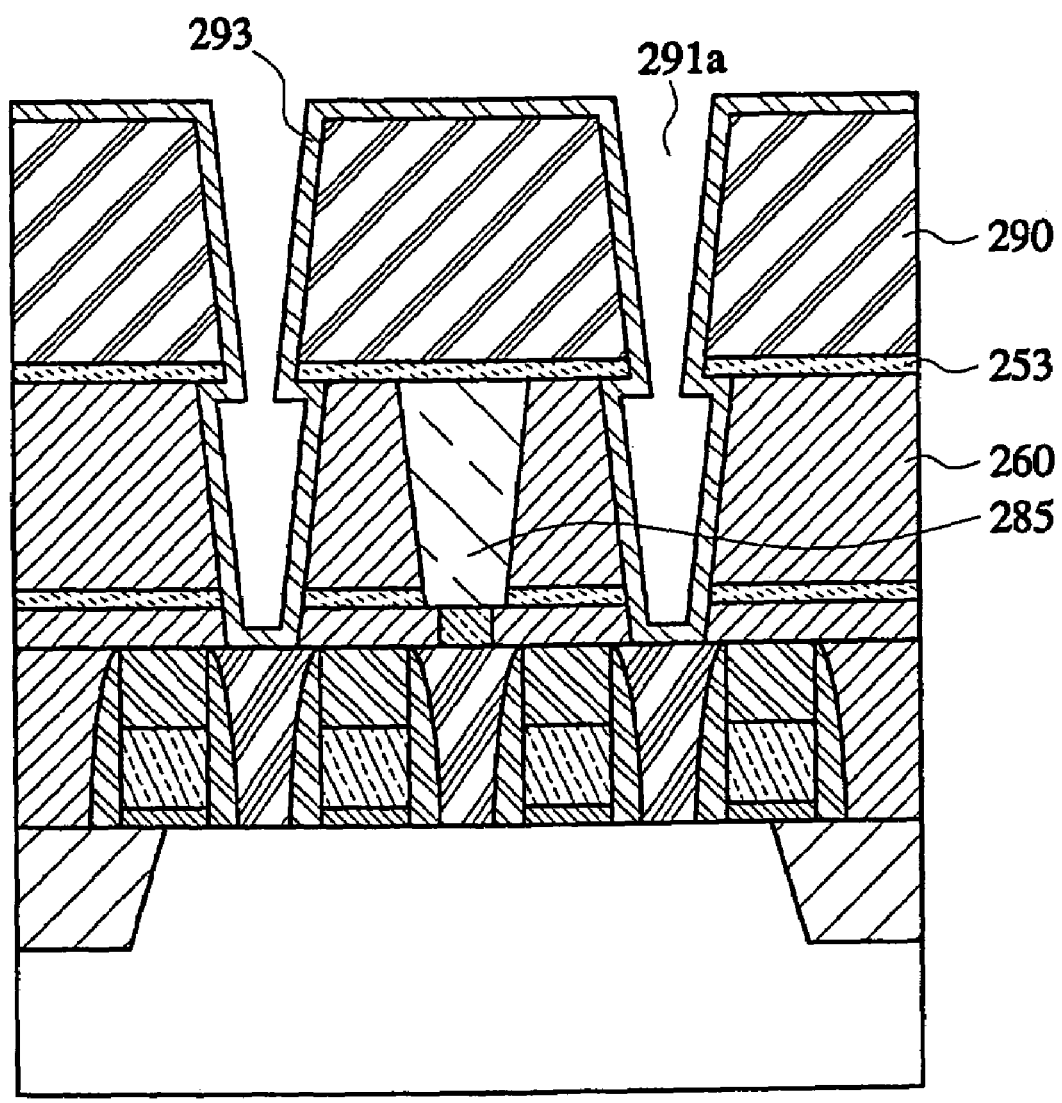

Referring to FIG. 2G, the exposed contact plug 281 is removed by a wet etching process to expose the storage node contact 261. Therefore, an opening 291a is formed, thereby exposing the storage node contact pad 231. Referring to FIG. 2H, a conductive material, for example, a polysilicon film 293, is deposited on the mold oxide film 290 including the opening 291a.

Figure 2I:
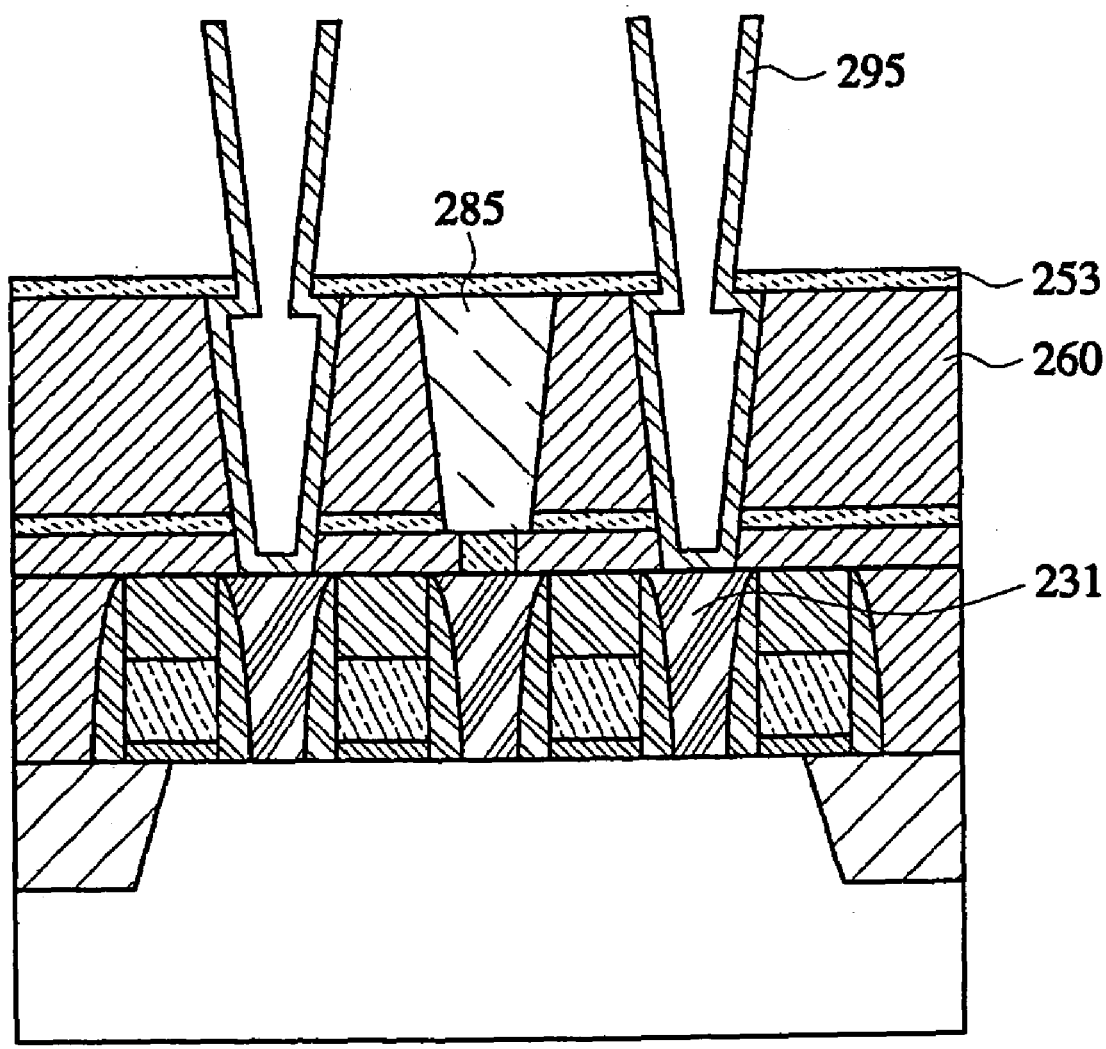

Referring to FIG. 2I, a sacrificial oxide film (not shown) is deposited to fill the opening 291a. A CMP process for node separation is performed and then the sacrificial oxide film and the mold oxide film 290 are removed to form a storage node 295 in contact with the storage node contact pad 231. A dielectric film (not shown) and a plate node for a capacitor (not shown) are formed on the storage node 295 to complete the capacitor.

The first through third interlayer insulating films 220, 240, and 260 are insulating films of the oxide series. The etching stoppers 251 and 253 use a material having an etching selectivity with respect to the second and third interlayer insulating films 240, 260 and the mold oxide film 290, for example, an insulating film of the nitride series.

If the method for fabricating the semiconductor device is applied to a method for fabricating a semiconductor device having a Metal-Insulator-Metal (MIM) capacitor, the contact plug of the MIM capacitor may be used without removing the contact plug formed in the storage node contact.

Figure 3:
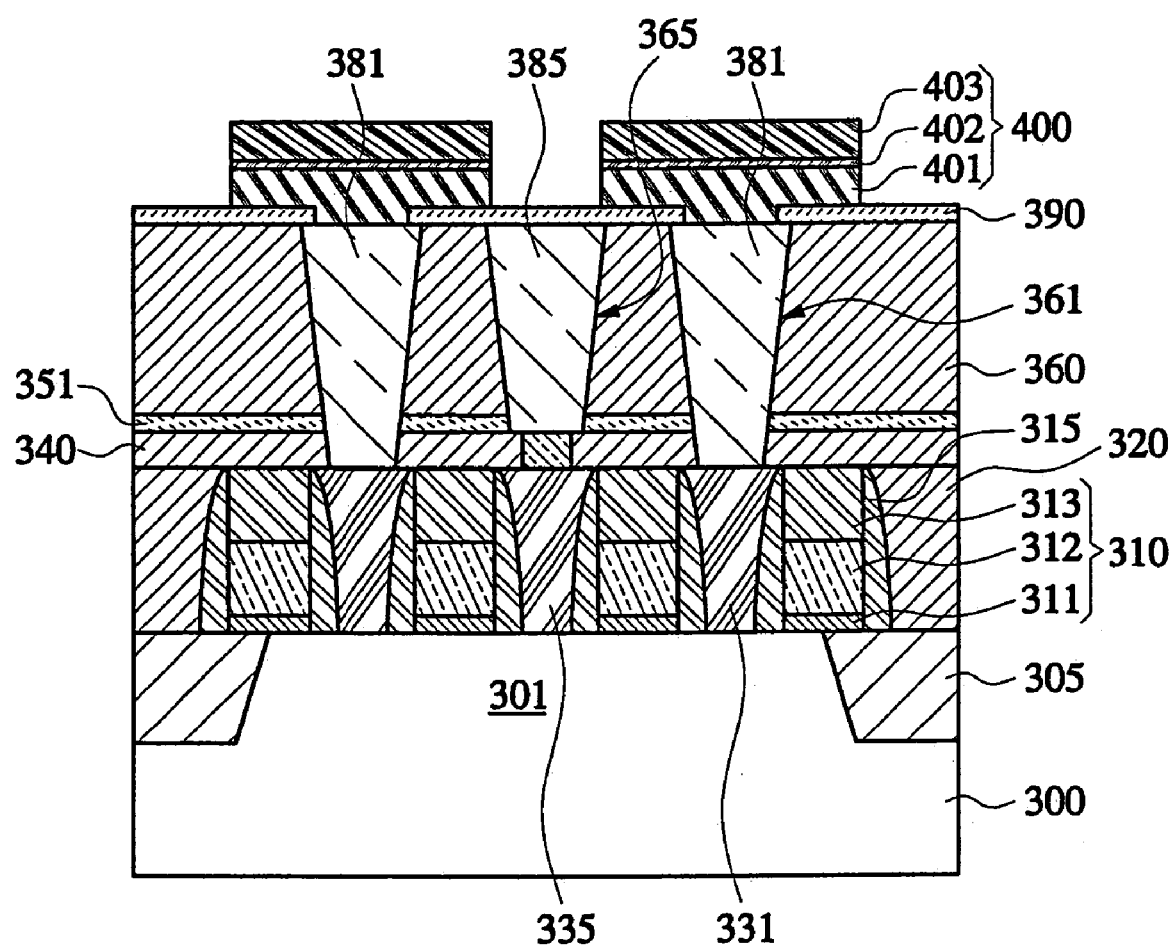
FIG. 3 is a cross sectional diagram illustrating a method of fabricating a semiconductor device according to another embodiment of the invention.

FIG. 3 is a cross sectional diagram of a semiconductor device having a MIM capacitor according to another embodiment of the invention. The process for forming the bit line 385 and the storage node contact plug 381 according to this embodiment of the invention is the same as the embodiment described in FIGS. 2A–2I.

Referring to FIG. 3, a field isolation film 305 is form on a region of the substrate 300. The substrate 300 includes an active region 301. A gate 310 having a stacked structure of a gate insulating film 311, a gate electrode material 312, and a capping layer 313 is formed on the semiconductor substrate 300 and a spacer 315 is formed on the side wall of the gate 310. A first interlayer insulating film 320 is deposited and then etched to form SACs (self aligned contacts) 325. The storage node contact pad 331 and the bitline contact pad 335 are formed in the contacts 325. A second interlayer insulating film 340 is formed on the first interlayer insulating film 320 and then etched to form a bitline contact 341 exposing the bitline contact pad 335.

A bitline contact plug 345 made of a conductive material, for example, a metal film such as a tungsten film, is formed in the bit line contact 341, and an etching stopper 351 and a third interlayer insulating film 360 are deposited on the substrate. The second and third interlayer insulating films 340, 360 and the etching stopper 351 are etched to form a storage node contact 361 exposing the storage node contact pad 331, and then the third interlayer insulating film 360 and the etching stopper 351 are etched using a photo sensitive film (not shown) to form a bit line pattern 365 that exposes the bitline contact plug 345.

Next, a conductive material, for example, a metal film such as a tungsten film, is deposited on the substrate including the storage node contact 361 and the bit line pattern 365. A CMP process for node separation is then used to form a bit line 385 in the bit line pattern 365 and simultaneously to form a storage node contact plug 381 in the storage node contact 361.

Next, an insulating film 390 is deposited on the substrate and then etched to form a contact opening 391 exposing the storage node contact plug 381. The insulating film 390 may use an etching stopper such as SiN, an interlayer insulating film of the oxide series, or another type of insulating film such as a stacked structure that includes both an etching stopper and an interlayer insulating film.

A metal insulator metal MIM capacitor 400 where a bottom metal electrode 401, a dielectric film 402 and an upper metal electrode 403 are stacked is formed to contact with the storage node contact plug 381 via the contact opening 391.

The method for fabricating the semiconductor device according to this embodiment of the invention is not only applicable to the MIM capacitor having a structure as shown in FIG. 3, but is applicable to a MIM capacitor having various other structures.

While the invention has been particularly shown and described with reference to preferred embodiments thereof, it will be understood by those skilled in the art that the foregoing and other changes in form and details may be made therein without departing from the spirit and scope of the invention as defined in the claims below.

What invention claimed is:

1. A method for fabricating a semiconductor device comprising:
    forming a first insulating film on a substrate, the first insulating film having a first contact pad and a second contact pad;
    forming a second insulating film on the first insulating film;
    etching the second insulating film to form a contact and a groove-shaped bit line pattern exposing the first contact pad and the second contact pad, respectively;
    simultaneously forming a contact plug and a bit line in the contact and in the bit line pattern, respectively, wherein the contact plug and the bit line are formed above the first contact pad and the second contact pad, respectively, and have upper surfaces that are co-planar; and
    forming a bottom electrode of a capacitor, the bottom electrode connected to the first contact pad.

2. The method according to claim 1, wherein etching the second insulating film comprises slope-etching the second insulating film.

3. The method according to claim 1, wherein simultaneously forming the contact plug and the bit line comprises:
    depositing a metal film on the second insulating film including the bit line pattern and the contact; and
    performing a chemical mechanical polishing process.

4. The method according to claim 1, wherein etching the second insulating film to form a groove-shaped bit line pattern and a contact comprises:
    forming a mask layer on the second insulating film including the contact to expose a portion of the second insulating film corresponding to the second contact pad; and
    forming the bit line pattern by etching the exposed portion of the second insulating film using the mask layer.

5. The method according to claim 4, wherein forming the mask layer on the second insulating film comprises forming a photosensitive film on the second insulating film.

6. The method according to claim 1, wherein forming the bottom electrode of the capacitor comprises:
    forming a third insulating film on the second insulating film;
    forming an opening exposing the contact plug by etching the third insulating film; and
    forming the bottom electrode on the third insulating film and inside the opening.

7. The method according to claim 6, wherein the third insulating film comprises:
    an insulating film chosen from the group consisting of an etching stopper, an interlayer insulating film, and a stacked film of an etching stopper and an interlayer insulating film.

8. The method according to claim 1, wherein forming the bottom electrode of the capacitor comprises:
    sequentially forming a third insulating film and a fourth insulating film on the second insulating film;
    etching the third and fourth insulating films to form a first opening that exposes the contact plug;
    removing the contact plug to form a second opening that exposes the contact;
    forming the bottom electrode in the first and second openings; and
    removing the third fourth insulating film.

9. The method according to claim 8, wherein removing the contact plug comprises removing the contact plug with a wet etching process.

10. The method according to claim 8, wherein sequentially forming the third insulating film and the fourth insulating film on the second insulating film comprises:
    sequentially forming an etching stopper and a sacrificial oxide film.

11. A method for fabricating a semiconductor device comprising:
    preparing a substrate having a first contact pad and a second contact pad;
    forming a first insulating film on the substrate;
    etching the first insulating film to form a contact and a groove-shaped bit line pattern exposing the first contact pad and the second contact pad, respectively;
    simultaneously forming a contact plug and a bit line in the contact and in the bit line pattern, respectively, wherein the contact plug and the bit line have upper surfaces that are co-planar; and
    forming a bottom electrode of a capacitor, the bottom electrode connected to the first contact pad, wherein forming the bottom electrode of the capacitor comprises, sequentially forming a second insulating film and a third insulating film on the first insulating film; etching the second and third insulating films to form a first opening that exposes the contact plug; removing the contact plug to form a second opening that exposes the first contact pad, forming the bottom electrode in the first and second openings, and removing the third insulating film.

12. The method according to claim 11, wherein removing the contact plug comprises removing the contact plug with a wet etching process.

13. The method according to claim 11, wherein sequentially forming the second insulating film and the third insulating film on the first insulating film comprises:
   sequentially forming an etching stopper and a sacrificial oxide film.

14. A method of fabricating a semiconductor device comprising:
   forming a first insulating film having a storage node contact pad and a bit line contact pad on a-substrate;
   forming a second insulating film having a bit line contact that exposes the bit line contact pad on the first insulating film;
   forming a bit line contact plug in the bit line contact;
   forming a third insulating film on the second insulating film;
   etching the second and third insulating films to form a groove-shaped bit line pattern and a storage node contact;
   simultaneously forming a bit line and a storage node contact plug in the bit line pattern and the storage node contact, respectively, the bit line and the storage node contact plug having upper surfaces that are coplanar;
   forming a fourth insulating film and a fifth insulating film on the third insulating film;
   etching the fourth insulating film and the fifth insulating film to form an opening that exposes the storage node contact plug;
   removing the storage node contact plug to expose the storage node contact;
   in the opening and the storage node contact, forming a storage node in contact with the storage node contact pad; and
   removing the fifth insulating film.

15. The method according to claim 14, wherein etching the second and third insulating films to form a groove-shaped bit line pattern and a storage node contact comprises:
   etching the second and third insulating films to expose the storage node contact pad;
   forming a mask layer on the third insulating film including the storage node contact to expose a portion of the third insulating film corresponding to the bit line contact pad; and
   forming the bit line pattern exposing the bit line contact plug by etching the exposed portion of the third insulating film using the mask layer.

16. The method according to claim 15, wherein the first, the second, and the third insulating films arc interlayer insulating films, the fourth insulating film is an etching stopper having an etching selectivity with respect to the second insulating film, the third insulating film, and the fifth insulating film, and the fifth insulating film is a sacrificial oxide film.

17. A method for fabricating a semiconductor device, comprising:
   forming a first insulating film having a storage node contact pad and a bit line contact pad on a substrate;
   forming a second insulating film having a bit line contact that exposes the bit line contact pad on the first insulating film;
   forming a bit line contact plug in the bit line contact;
   forming a third insulating film on the second insulating film;
   etching the second and third insulating films to form a groove-shaped bit line pattern and a storage node contact;
   simultaneously forming a bit line and a contact plug in the bit line pattern and the storage node contact above the bit line contact pad and the storage node contact pad, respectively, the bit line and the contact plug having upper surfaces that are coplanar;
   forming a fourth insulating film having an opening that exposes the contact plug on the third insulating film; and
   forming a metal electrode in contact with the contact plug through the opening on the fourth insulating film.

18. The method according to claim 17, wherein etching the second and third insulating films to form a groove-shaped bit line pattern and a storage node contact comprises:
   etching the second and third insulating films to expose the storage node contact pad;
   forming a mask layer on the third insulating film including the storage node contact to expose a portion of the third insulating film corresponding to the bit line contact pad; and
   forming the bit line pattern exposing the bit line contact plug by etching the exposed portion of the third insulating film using the mask layer.

19. The method according to claim 17, wherein the fourth insulating film comprises a film chosen from the group consisting of an etching stopper, an interlayer insulating film, and a stacked film of an etching stopper and an interlayer insulating film.

20. A semiconductor device, comprising:
   a first insulating film having a bit line contact pad and a storage node contact pad;
   a second insulating film including a groove-shaped bit line pattern that exposes the bit line contact pad and a storage node contact that exposes the storage node contact pad, the bit line pattern and the storage node contact having upper portions that are coplanar;
   a bit line formed in the bit line pattern and above the bit line contact pad;
   a third insulating film having an opening that exposes the storage node contact; and
   a bottom electrode for a capacitor formed in the storage node contact and above and in contact with the storage node contact pad.

21. The semiconductor device according to claim 20, wherein the third insulating film comprises a material having an etching selectivity with respect to the second insulating film.

22. A semiconductor device comprising:
   a first insulating film having a bit line contact pad and a storage node contact pad;
   a second insulating film including a groove-shaped bit line pattern exposing the bit line contact pad and a storage node contact exposing the storage node contact pad, the bit line pattern and the storage node contact having upper portions that are coplanar;

a bit line formed in the bit line pattern and above the bit line contact pad;
a contact plug formed in the storage node contact and above the storage node contact pad;
a third insulating film having an opening that exposes the contact plug; and
a bottom electrode for a capacitor formed in the opening and in contact with the contact plug.

23. The semiconductor device according to claim 22, wherein the third insulating film comprises a film chosen from the group consisting of an etching stopper, an interlayer insulating film, and a stacked film of an etching stopper and an interlayer insulating film.

* * * * *